(12) United States Patent
Matsuoka et al.

(10) Patent No.: US 8,445,871 B2
(45) Date of Patent: *May 21, 2013

(54) PATTERN MEASUREMENT APPARATUS

(75) Inventors: Ryoichi Matsuoka, Yotsukaido (JP); Akihiro Onizawa, Mito (JP); Akiyuki Sugiyama, Hitachinaka (JP); Hidetoshi Morokuma, Hitachinaka (JP); Yasutaka Toyoda, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 105 days.

This patent is subject to a terminal disclaimer.

(21) Appl. No.: 12/763,710

(22) Filed: Apr. 20, 2010

(65) Prior Publication Data

US 2010/0202654 A1 Aug. 12, 2010

Related U.S. Application Data

(63) Continuation of application No. 12/188,791, filed on Aug. 8, 2008, now Pat. No. 7,732,792.

(30) Foreign Application Priority Data

Aug. 9, 2007 (JP) .................................. 2007-207344

(51) Int. Cl.
*H01J 37/28* (2006.01)
*G01N 23/00* (2006.01)

(52) U.S. Cl.
USPC ................... 250/492.22; 250/492.2; 250/310; 250/311; 250/306; 250/307

(58) Field of Classification Search
USPC ................. 250/492.22, 492.2, 310, 311, 306, 250/307

See application file for complete search history.

(56) References Cited

U.S. PATENT DOCUMENTS

| 5,523,567 | A | * | 6/1996 | Kawamata et al. | ........... 250/310 |
| 6,768,958 | B2 | | 7/2004 | Ivanovic et al. | |

(Continued)

FOREIGN PATENT DOCUMENTS

| JP | 07-046370 B2 | 5/1995 |
| JP | 07-130319 | 5/1995 |
| JP | 8-007818 A | 1/1996 |
| JP | 2000-177961 | 6/2000 |

(Continued)

OTHER PUBLICATIONS

Japanese Office Action, and partial English translation thereof, issued in Japense Patent Application No. 2007-207344 dated Aug. 15, 2012.

(Continued)

*Primary Examiner* — Nikita Wells
(74) *Attorney, Agent, or Firm* — McDermott Will & Emery LLP

(57) ABSTRACT

Mutual compatibility is established between the measurement with a high magnification and the measurement in a wide region. A pattern measurement apparatus is proposed which adds identification information to each of fragments that constitute a pattern within an image obtained by the SEM, and which stores the identification information in a predetermined storage format. Here, the identification information is added to each fragment for distinguishing between one fragment and another fragment. According to the above-described configuration, it turns out that the identification information is added to each fragment on the SEM image which has possessed no specific identification information originally. As a result, it becomes possible to implement the SEM-image management based on the identification information.

16 Claims, 12 Drawing Sheets

U.S. PATENT DOCUMENTS

| | | | |
|---|---|---|---|
| 7,049,589 B2 | 5/2006 | Yamaguchi et al. | |
| 7,068,808 B1 | 6/2006 | Prokoski | |
| 7,449,689 B2 | 11/2008 | Nagamoto et al. | |
| 7,490,009 B2 * | 2/2009 | Gottlieb et al. | 702/32 |
| 7,507,961 B2 * | 3/2009 | Toyoda et al. | 250/310 |
| 7,518,110 B2 | 4/2009 | Sutani et al. | |
| 7,602,938 B2 | 10/2009 | Prokoski | |
| 7,732,792 B2 * | 6/2010 | Matsuoka et al. | 250/492.22 |
| 8,041,103 B2 * | 10/2011 | Kulkarni et al. | 382/144 |
| 2006/0045326 A1 | 3/2006 | Toyoda et al. | |

FOREIGN PATENT DOCUMENTS

| | | |
|---|---|---|
| JP | 2002-050572 A | 2/2002 |
| JP | 2006-066478 | 3/2006 |
| JP | 2006-234808 A | 9/2006 |

OTHER PUBLICATIONS

Japanese Office Action issued Feb. 15, 2013 in corresponding Japanese Application No. 2007-207344.

* cited by examiner

CONCEPTUAL DIAGRAM FOR ILLUSTRATING
HIERARCHICAL STRUCTURE OF FOVS

BEARD-ELIMINATING ALGORITHM

PATTERN MEASUREMENT APPARATUS

RELATED APPLICATIONS

This application is a Continuation of U.S. patent application Ser. No. 12/188,791, filed on Aug. 8, 2008, now U.S. Pat. No. 7,732,792, claiming priority of Japanese Patent Application No. 2007-207344, filed on Aug. 9, 2007, the entire contents of each of which are hereby incorporated by reference.

BACKGROUND OF THE INVENTION

The present invention relates to an apparatus for making measurement and inspection of a pattern based on design data on a semiconductor device or the like and the image obtained by a scanning electron microscope. More particularly, it relates to a pattern measurement apparatus for adding identification information to line segments within the electron-microscope image, and managing the pattern-forming line segments based on the identification information.

In recent years, the design data on a semiconductor device has increasingly come into use for the measurement on the semiconductor device by the scanning electron microscope (: SEM). In JP-A-2006-66478 (corresponding to US 2006/0045326), the following embodiment is explained: A pattern matching is performed between line segments based on the design data and contour lines of patterns obtained by the scanning electron microscope. Then, a pattern is measured which is identified by this pattern matching.

Moreover, in JP-A-2000-177961 (corresponding to U.S. Pat. No. 6,768,958), the following embodiment is explained: Pattern edge of a mask pattern on the electron-microscope image is stored into a database, using a standard format such as GDSII.

In JP-A-7-130319 (corresponding to U.S. Pat. No. 5,523, 567), there is disclosed a technology for forming an extremely-low-magnification image by mutually connecting a plurality of field-of-views to each other.

A SEM image itself is merely two-dimensional luminance information. Accordingly, the edge represented on the SEM image has none of information about what the edge itself indicates. Consequently, when identifying a pattern of measurement purpose or the like, it becomes necessary to perform position identification by the pattern matching as is explained in JP-A-2006-66478.

Meanwhile, in accompaniment with the microminiaturization of semiconductor devices in recent years, the measurement based on an even-higher-magnification image has become more and more requested. For example, in order to grasp an extent of the pattern correction by OPC (Optical Proximity Correction), it is required to measure a certain part of the pattern which will be modified as a result of being influenced by the OPC pattern. If, however, the measurement is made using the high magnification needed for evaluating a location like this, there occurs the following problem: Namely, it becomes increasingly difficult to involve, within the field-of-view, the entire pattern, or a range of the pattern needed at least for identifying configuration of the pattern.

The acquisition of an image with a high magnification, on the other hand, results in the acquisition of the image in only a narrow field-of-view. As a consequence, it has been found difficult to establish mutual compatibility between the high-magnification observation for high-resolution implementation and the observation in a wide region. In the explanation in JP-A-2000-177961 as well, no disclosure is made concerning a proposal which would be able to simultaneously solve mutually incompatible problems like this. Furthermore, according to the technology disclosed in JP-A-7-130319, on the contrary, such a processing as thinning out scanning lines is performed in order to form the extremely-low-magnification image. Accordingly, this technology is unsuitable for accomplishment of the purpose of the high-magnification observation for high-resolution implementation.

SUMMARY OF THE INVENTION

One of the main objects of the present invention is to establish the mutual compatibility between the measurement with a high magnification and the measurement in a wide region. Another object thereof is to provide a pattern measurement apparatus which, even in the case of the edge information based on a SEM image, makes it possible to implement the management of the edge information that is equivalent to the management of the design data.

As an aspect for accomplishing the above-described objects, the following pattern measurement apparatus is proposed: Namely, the pattern measurement apparatus adds identification information to each of fragments which constitute a pattern within the image obtained by the SEM, and stores the identification information in a predetermined storage format. Here, the identification information is added to each fragment for distinguishing between one fragment and another fragment.

According to the above-described configuration, it turns out that the identification information is added to each fragment on the SEM image which has possessed no specific identification information originally. As a consequence, it becomes possible to implement the management of the SEM image based on the identification information. Giving an example, a case is considered where a superimposed image is formed by mutually connecting images of a plurality of field-of-views to each other. In this case, at the time of the formation, the mutual connection between the field-of-views is performed in such a manner that fragments having identification information which is common to the field-of-views are mutually connected to each other. Consequently, at the time of forming the mutually-connected image, this method allows implementation of the mutual connection based on high-accuracy position alignment with no shift appearing between the field-of-views. In Description of the INVENTION, the explanation will be given concerning more concrete configuration and effects of the present invention.

Other objects, features and advantages of the invention will become apparent from the following description of the embodiments of the invention taken in conjunction with the accompanying drawings.

DESCRIPTION OF THE EMBODIMENTS

Figure 1:
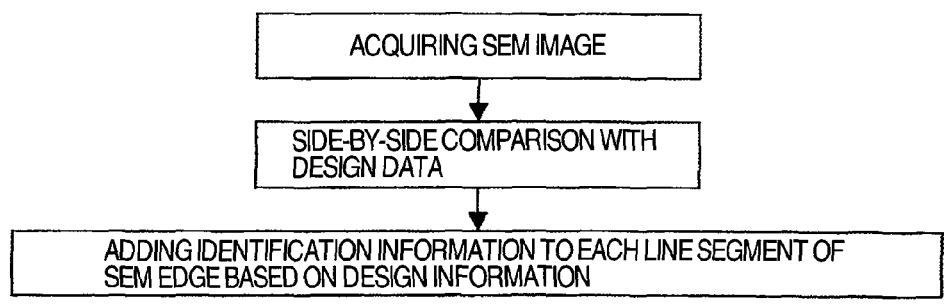
FIG. 1 is a flowchart for explaining procedure steps of adding identification information to each line segment (fragment) of SEM edge.
Figure 2:
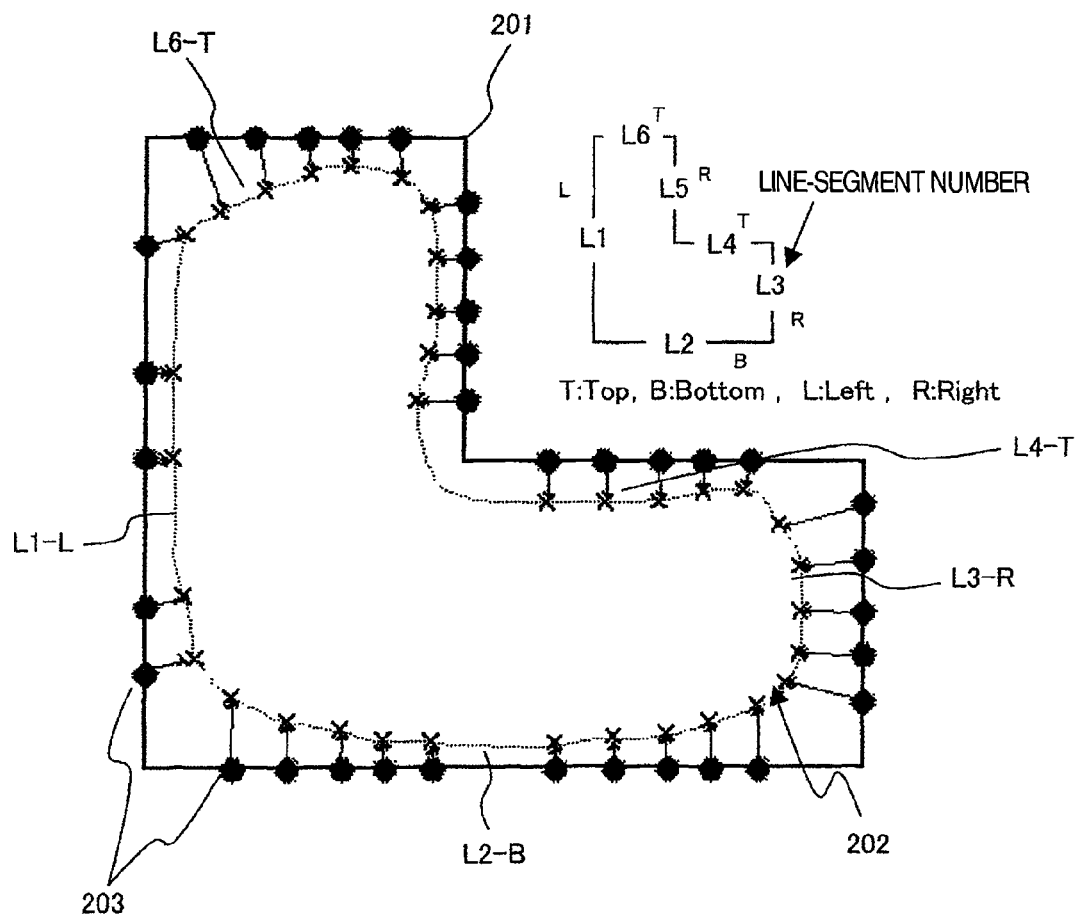
FIG. 2 is a diagram for explaining an embodiment where the identification information is added to the SEM edge.

Hereinafter, the explanation will be given below concerning the following embodiment: A side-by-side checking (i.e., comparison) is made between the edge portion of a SEM (: Scanning Electron Microscope) image formed by an electron microscope and the design data, thereby adding identification information to the SEM edge which constitute each fragment of the pattern. In FIG. 1, the SEM edge is extracted from a SEM image formed by an electron microscope, then making a side-by-side checking between each line segment of the SEM edge and the design data. The design data includes a variety of information about the pattern. In the present embodiment, however, information specific to each line segment constituting the pattern is extracted in particular out of this variety of information. Then, the information extracted is applied as the identification information for each fragment. FIG. 2 is a diagram for explaining an embodiment where the identification information is added to the SEM edge. If the identification information about each line segment of the pattern is stored in the original design data, it is all right just to use this information. If, however, the identification information is not stored therein, it is possible to allocate the identification information for each line segment thereto in accordance with a predetermined rule. FIG. 2 is the diagram for explaining the embodiment of such a case.

FIG. 2 is the explanatory diagram for explaining the embodiment where the identification information is added to each fragment of the SEM edge in accordance with a predetermined algorithm. Namely, FIG. 2 is the diagram for explaining the following embodiment: After a matching between the design data 201 and the line segments 202 based on the SEM edge has been performed, the identification information specific to each line segment is automatically allocated to each line segment. This allocation is performed based on position information (i.e., Top, Left, Bottom, Right) within the field-of-view of the line segments, and an algorithm of allocating numbers sequentially in a counter-clockwise direction from the line segment existing on the leftmost side. Incidentally, the line segments 202 are formed by converting the SEM edge into a contour line (i.e., contour-line conversion). The outline of the contour-line conversion will be described later.

Figure 3:
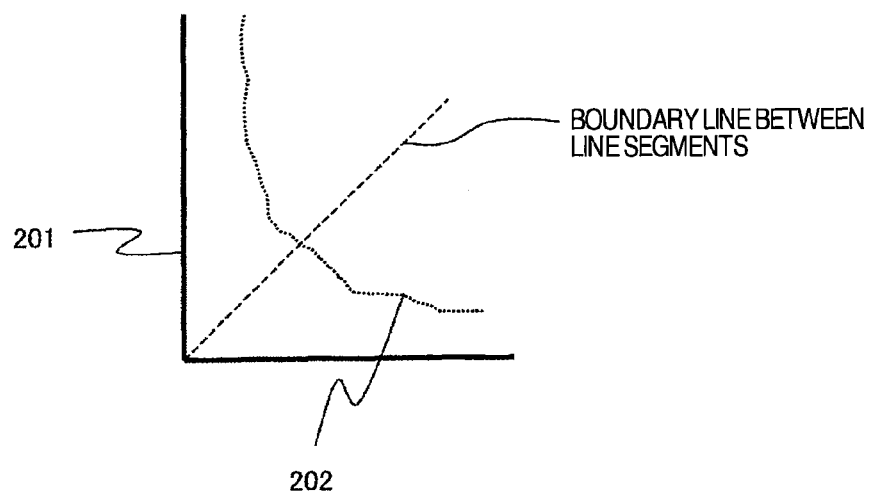
FIG. 3 is a diagram for explaining a determination method for boundary line of the SEM edge.

Moreover, in order to judge which of line segments of the design data 201 each fragment constituting the line segments 202 is associated with, positions of the line segments 202 are determined which are the closest to a plurality of measurement points 203 allocated to each fragment of the design data 201. Based on identification information on the line segments of the design data 201 to which the measurement points 203 belong, the identification information is added to each line segment of the line segments 202. Also, a boundary between the respective line segments of the line segments 202 may be determined by drawing a straight line such that, as illustrated in, e.g., FIG. 3, the vertex angle of the design data 201 is divided into two, and determining the boundary between the line segments depending on to which of the two-divided regions each line segment 202 belong.

As explained above, the identification information is added to each line segment of the SEM edge on the basis of the design data. This addition of the identification information makes it possible to easily implement inspections and measurements in which each line segment is used. In the explanation hereinafter, their concrete examples will be explained in detail using the accompanying drawings. Of course, it is needless to say that the above-described identification-information addition method to the line segments 202 is merely one example, and that a variety of modifications can be made within a range of not departing from the spirit of the present invention.

Figure 4:
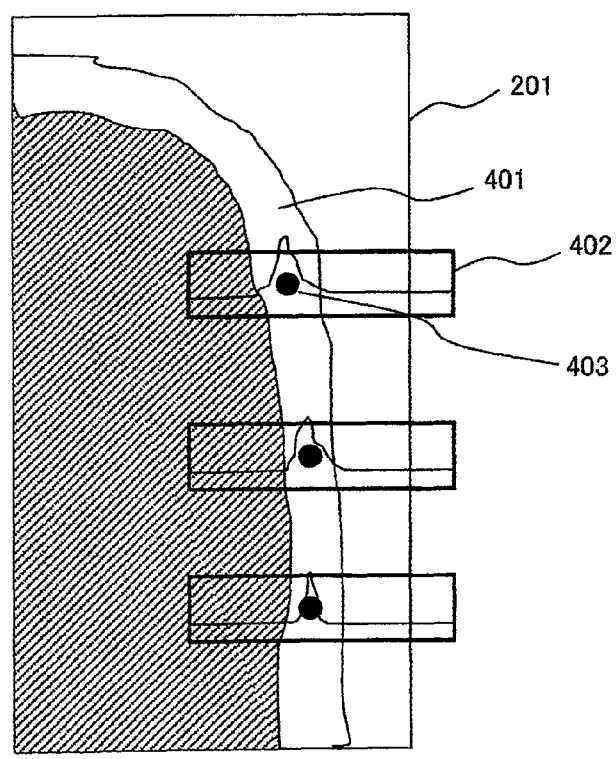
FIG. 4 is a diagram for explaining an embodiment where conversion of the edge into a contour line is performed based on luminance information of white band.

Incidentally, in the present embodiment, the processing of adding the identification information has been applied to the SEM edge which is converted into the contour line. The technology for implementing the contour-line conversion is, e.g., as follows:

FIG. 4 is a diagram for explaining the correspondence relationship between a white band 401 of a pattern on the SEM image and luminance-profile peak positions of the white band 401. In FIG. 4, right-half of the edge portion of the pattern is displayed on the SEM image. In the present embodiment, the contour-line conversion of the SEM edge is executed as follows: Luminance-signal extraction regions 402 are set such that the regions 402 include the white band 401. Then, the luminance distribution is determined in a direction intersecting the pattern edge. Finally, the contour-line conversion of the SEM edge is executed by mutually connecting the luminance-distribution peak positions 403 or locations having a predetermined luminance to each other. As illustrated in FIG. 4, the white band 401 on the SEM image is image information which has its own width, and has a convex-shaped luminance distribution. In the present embodiment, in order to make the comparison with the design data, the white band is converted into the line-segment information as is the case with the design data. Incidentally, the white band is the image information which occurs in a pattern having gradient or protrusion, and which is characteristic of a charged-particle beam apparatus typical of which is SEM. As illustrated in FIG. 4, the white band is showed up in white on the SEM image.

Incidentally, the contour-line conversion technology explained in the present embodiment is, after all, merely one example. Namely, various types of conversion technologies are applicable, as long as they are technologies capable of converting the white band or SEM edge into a narrow line, and tracing situation of the white band or the like with a high accuracy.

The line-segment information to which the identification information is added as described above is stored into a storage medium in a standard format such as, e.g., GDSII. In the present embodiment, GDSII is also used as the format of the design data on the original semiconductor device. In this way, the SEM-edge information is registered in the same format as that of the original design data. This registration scheme makes it possible to address the SEM-edge information in the same way as in the design data. This point will be described later.

Figure 5:
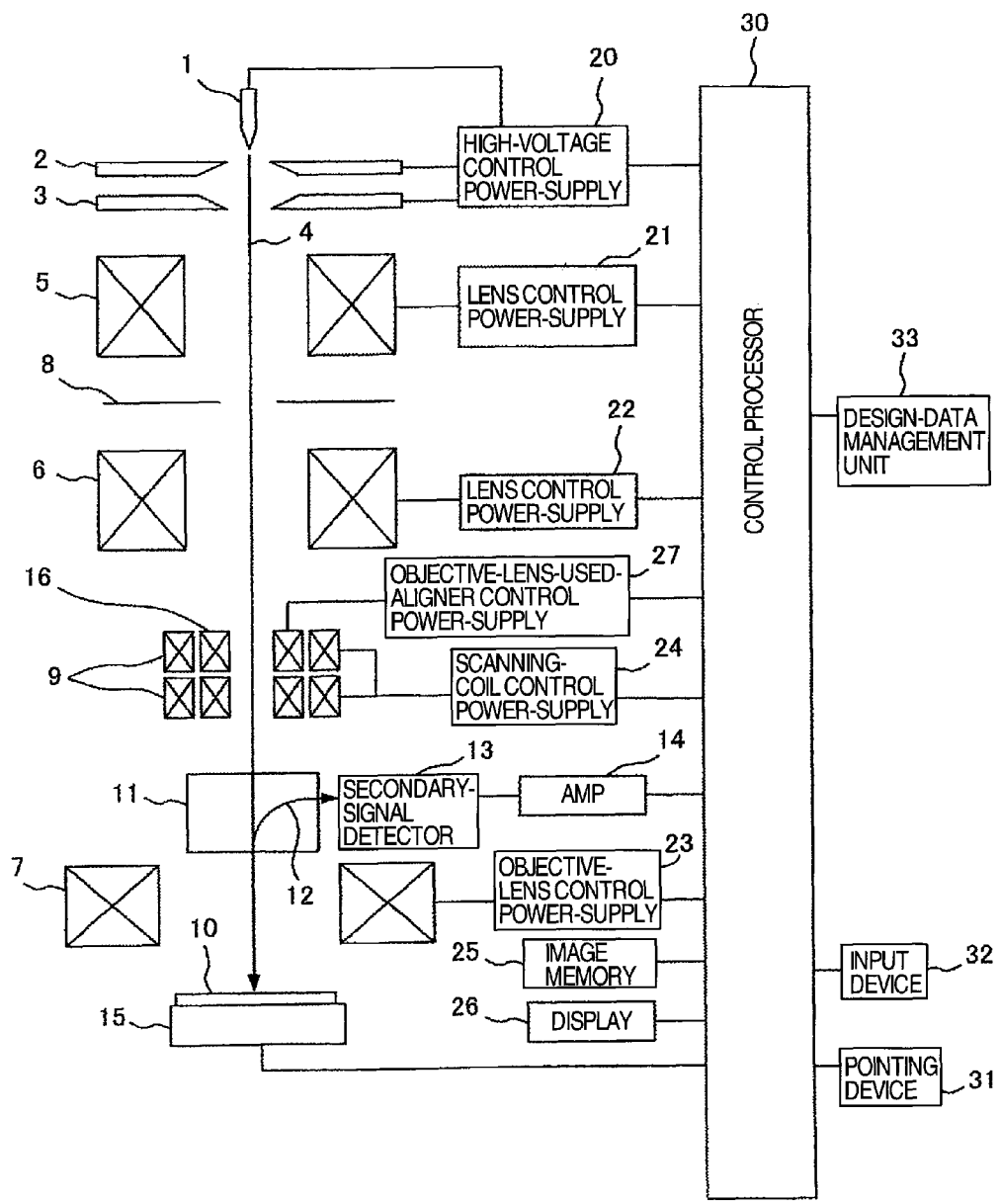
FIG. 5 is a diagram for explaining the overview of a scanning electron microscope.

Hereinafter, referring to the drawings, the explanation will be given below concerning the more concrete practical embodiments. FIG. 5 is a diagram for explaining the overview of a scanning electron microscope for acquiring a SEM image.

Hereinafter, referring to FIG. 5, the explanation will be given below regarding the scanning electron microscope (which, hereinafter, will be referred to as "SEM" in some cases). A voltage is applied between a cathode 1 and a first anode 2 by a high-voltage control power-supply 20 which is controlled by a control processor 30. A primary electron beam 4 is derived from the cathode 1 by this applied voltage as a predetermined emission current. An acceleration voltage is applied between the cathode 1 and a second anode 3 by the high-voltage control power-supply 20 controlled by the control processor 30. The primary electron beam 4 emitted from the cathode 1 is accelerated by this acceleration voltage, thereby being caused to travel toward a subsequent-stage lens system.

The primary electron beam 4 is converged by a convergence lens 5 which is current-controlled by a lens control power-supply 21 controlled by the control processor 30. Then, an unnecessary region of the primary electron beam 4 is removed by a diaphragm plate 8. After that, the primary electron beam 4 is converged onto a sample 10 as an infinitesimal spot by a convergence lens 6 which is current-controlled by a lens control power-supply 22 controlled by the control processor 30, and an objective-lens control power-supply 23 controlled by the control processor 30. The objective lens 7 can assume various configuration modes such as in-lens scheme, out-lens scheme, and snorkel scheme (semi in-lens scheme). Also, retarding scheme is possible which decelerates the primary electron beam 4 by applying a negative voltage to the sample 10. Moreover, each lens may also be configured with an electrostatic-type lens including a plurality of electrodes to which a controlled voltage is applied.

The primary electron beam 4 is scanned two-dimensionally on the sample 10 by a scanning coil 9 which is current-controlled by a scanning-coil control power-supply 24 controlled by the control processor 30. A secondary signal 12 such as secondary electrons, which is generated from the sample 10 by the irradiation with the primary electron beam 4, travels to a top portion of the objective lens 7. After that, the secondary signal 12 is separated from the primary electrons by an orthogonal-electromagnetic-field generation device 11 for separating the secondary signal, then being detected by a secondary-signal detector 13. The signal detected by the secondary-signal detector 13, after being amplified by a signal amplifier 14, is transferred to an image memory 25 to be displayed on an image display 26 as the sample image. A two-stage deflection coil (objective-lens-used aligner) 16, which is deployed at the same position as that of the scanning coil 9, makes it possible to two-dimensionally control the pass-through position of the primary electron beam 4 with respect to the objective lens 7. Here, the coil 16 is current-controlled by an objective-lens-used-aligner control power-supply 27 controlled by the control processor 30. A stage 15 is capable of displacing the sample 10 in at least two directions (i.e., X direction and Y direction) within a plane perpendicular to the primary electron beam 4. This displacement makes it possible to change the scanning region by the primary electron beam 4 on the sample 10.

A pointing device 31 allows specification of the position of the sample image displayed on the image display 26, and acquisition of the information thereabout. An input device 32 allows specifications of image grabbing conditions (i.e., scanning rate, and images' totalized number-of-pieces), field-of-view correction scheme, and output and saving of the images.

Incidentally, address signals corresponding to memory positions in the image memory 25 are generated inside the control processor 30, or inside a control computer set up separately. Then, the address signals, after being analog-converted into analog signals, are supplied to the scanning-coil control power-supply 24. When the image memory 25 has, e.g., 512×512 pixels, the address signals in the X direction are digital signals which repeat from 0 to 512. Also, the address signals in the Y direction are digital signals which repeat from 0 to 512, and which are incremented by 1 when the address signals in the X direction attain to from 0 to 512. These digital address signals are converted into the analog signals.

The addresses of the image memory 25 and addresses of deflection signals for scanning the electron beam are in a one-to-one correspondence with each other. As a result, the two-dimensional image of a deflection region of the electron beam by the scanning coil 9 is recorded into the image memory 25. Additionally, the signals inside the image memory 25 can be read one after another in time sequence by a read-address generation circuit which is synchronized with a read clock. The signals read in correspondence with the addresses are analog-converted, then becoming luminance modulation signals of the image display 26.

Also, the apparatus explained in the present embodiment is equipped with a function of forming a line profile based on the detected secondary electrons or reflected electrons. The line profile is formed based on the electron detection amount at the time when the primary electron beam 4 is scanned one-dimensionally or two-dimensionally on the sample 10, the luminance information on the sample image, or the like. The line profile thus obtained is used for, e.g., the size measurement on a pattern formed on a semiconductor wafer or the like.

Incidentally, in FIG. 5, the explanation has been given assuming that the control processor 30 is integrated with the scanning electron microscope, or is in a configuration compatible therewith. It is needless to say, however, that the configuration is not limited thereto. Namely, the processing explained so far may be performed by a processor which is provided separately from the scanning electron microscope. At this time, the following appliances become necessary: A transmission medium for transmitting the detection signal detected by the secondary-signal detector 13 to the control processor 30 as an image, or transmitting a signal to the objective-lens control power-supply 23 or the scanning-coil control power-supply 24 from the control processor 30, and an input/output terminal for inputting/outputting the signals transmitted via the transmission medium.

Moreover, the apparatus in the present embodiment is equipped with a function of storing in advance, as a recipe, conditions (i.e., measurement locations, optical conditions of the scanning electron microscope, and the like) at the time of observing, e.g., a plurality of points on the semiconductor wafer, and making the measurement and observation in accordance with the contents of the recipe.

Also, a program for performing a processing which will be explained hereinafter may be registered into a storage medium, and the program may be executed by a processor for supplying necessary signals to the scanning electron microscope and the like. Namely, the embodiment which will be explained hereinafter is about the program employable in a charged-particle beam apparatus such as the scanning electron microscope that is capable of acquiring the image, or an explanation as a program product.

Furthermore, the design data on the circuit pattern of a semiconductor device represented in the GDS format or OASIS format may be stored into the control processor 30. Then, a design-data management unit 33 for converting the design data into data needed for the control over the SEM may be connected to the control processor 30. The design-data management unit 33 is equipped with a function of generating the recipe for controlling the SEM on the basis of the inputted design data. Also, the unit 33 is equipped with a function of processing the design data on the basis of the signal transmitted from the control processor 30. Also, the processing which will be explained hereinafter may be performed using a processor which is provided inside the design-data management unit 33. In addition, in substitution for the control processor 30, the scanning electron microscope may also be controlled using the processor provided inside the design-data management unit 33.

Additionally, in the explanation of the present embodiment, the design-data management unit 33 will be explained as a separated unit provided separately from the control processor 30. Its configuration, however, is not limited thereto. Namely, the design-data management unit 33 may also be integrated with the control processor 30, for example.

In the present embodiment, the sample 10 is assumed to be a wafer which is deployed in the semiconductor-product fabrication processes. A resist pattern formed on the wafer by the lithography process is used. As a comparison target with this resist pattern, the design data on the circuit pattern of a semiconductor device is used which turns out to be the original of this resist pattern.

The design data on the circuit pattern of a semiconductor device refers to an ideal pattern configuration at the time when the circuit of the semiconductor device is finally formed on the wafer. Incidentally, in the explanation hereinafter, the semiconductor wafer is selected as the inspection target. The configuration, however, is not limited thereto, as long as the design data and a target to be evaluated form a pair. The explanation hereinafter is also effective to a mask pattern which is formed on a glass substrate, and which is used when exposing the semiconductor pattern on a wafer, and a pattern which is formed on such a glass substrate as liquid-crystal panel. Also, regarding the type of the design data on a circuit pattern, whatever type is all right as long as software for displaying the design data on a circuit pattern is capable of displaying its format scheme and addressing the design data as graphics data.

Figure 6:
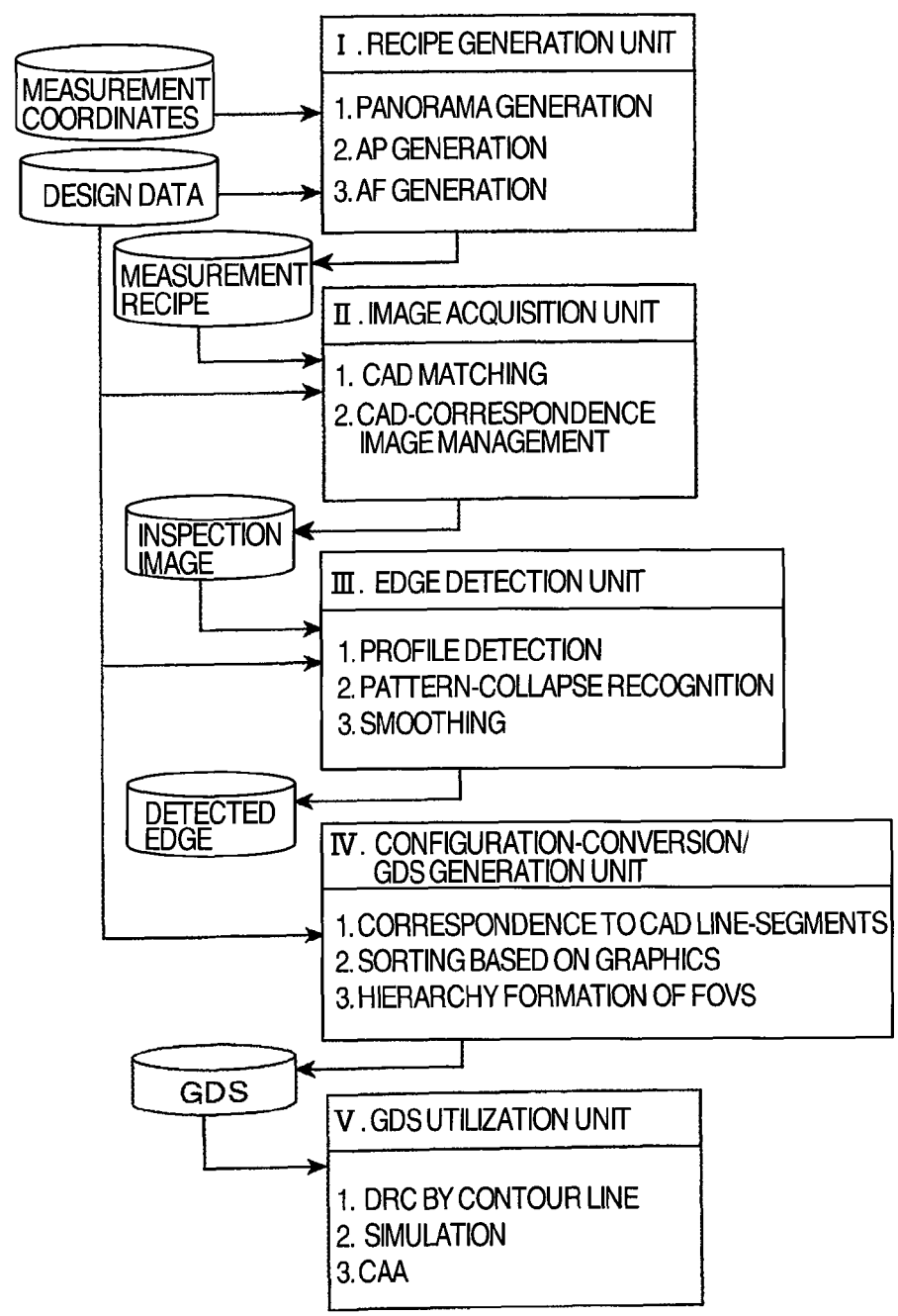
FIG. 6 is a diagram for explaining a flow of the processing for performing verification of a pattern based on the contour-line information.

FIG. 6 is a diagram for explaining a basic flow of the processing, which ranges from the acquisition of the SEM image to the verification of a pattern using the predetermined-formatted contour-line information formed based on the SEM image acquired (in the present embodiment, the GDS format is used as the predetermined format). This processing is executed in the design-data management unit 33 explained in FIG. 5, or in the control processor 30.

Also, in the design-data management unit 33, or in the control processor 30 (the unit 33 and the processor 30, in some cases, are referred to as simply "control unit", which is a term including both of them). The contour-line conversion of a pattern configuration also makes it possible to extract configuration abnormality or defect configuration of a peripheral pattern including this pattern. Also, generating this contour line as the format of the pattern design data makes it possible to use the evaluation and verification technologies used in the various types of design methodologies. This feature has allowed implementation of high-accuracy yield management and enhancement in the semiconductor fabrication processes.

Moreover, by representing the contour line of a pattern configuration by using the design data having a hierarchical structure, it becomes possible to represent the contour line in such a manner that the contour line is in a correspondence relationship with the structure of the design data on the circuit. This feature allows the good-or-bad of the verification result on the contour line to be directly reflected on the design data, thereby making it possible to confirm, predict, and amend the design data. Accordingly, it becomes possible to address a design unsuccessfulness more swiftly, and to make a contribution to the yield enhancement.

By intimately coordinating the recipe generation system originating from the design data and the image acquisition scheme based on the design data, the contour-line conversion is performed while being caused to be related with the design data which became the original of the fabrication. This feature allows implementation of high-accuracy configuration reproduction or high-accuracy extraction of the defect configuration. Additionally, in the explanation hereinafter, not being limited to a transferred pattern of the silicon, mention will also be made to application of a semiconductor mask pattern.

Hereinafter, the explanation will be given below concerning the concrete function of each configuration component explained in FIG. 6.

(1) Outline of Recipe Generation Unit

In a recipe generation unit, measurement coordinates and the design data are inputted which correspond to the pattern design data for fabricating a semiconductor pattern. Then, a recipe for making the measurement is generated automatically. These measurement points includes coordinates of a critical point at the time of the lithography and processing, critical points of circuit-performance-associated factors (element characteristics, wiring delay, and via), CAA/DRC, and the like. These measurement points are inputted, then generating the recipe for the photographing (i.e., scanning by the scanning electron microscope). Namely, positions of measurement targets, photographing magnification, and alignment pattern position (AP) and autofocus position (AF) for achieving a measurement field-of-view are generated automatically.

In the recipe generation unit, the design data is used as reference for the inspection. This feature allows implementation of determination of the measurement positions and field-of-view range with the design data used as the reference, and implementation of an enhancement in preciseness in the photographing of the measurement data with configuration of the range used as the reference.

Hereinafter, the explanation will be given below concerning a recipe generation technologies which is preferable for extracting, from an image for the measurement/inspection target, a contour configuration which represents configuration of the image accurately.

Hereinafter, the detailed description will be given below regarding optimization of the photographing field-of-view positions for the measurement and inspection, and an optimization technology for its photographing conditions.
Concerning the Optimization Technology for the Photographing Field-of-View Positions (i.e., Acquisition of a Panorama Image Based on Measurement Points)

When an inspection target pattern is converted into a contour line to perform its configuration evaluation, a contour line of panorama synthesis is generated. As will be explained hereinafter, this contour line of the panorama synthesis is generated by combining FOVs (: Field-Of-Views) at the respective measurement points with each other. This contour line makes it possible to generate the contour line of the inspection target in a wide range while maintaining accuracy of the contour line of each FOV in a sub-nanometer unit.

Also, since the contour-line generation processing is performed on each FOV basis, the parallel processing calculation becomes executable. This parallel calculation allows implementation of speeding-up of the processing.

In this recipe generation, when extracting the contour line from the image of the photographing result, it is required to take into consideration the connection at the boundary on each field-of-view basis, and to perform a setting of the FOVs where an overlap amount to some extent is predicted and added. This setting of the FOVs allows implementation of a high-accuracy connection portion in the connection of the contour lines on each field-of-view basis. Using the drawing, this setting will be explained hereinafter.

(1-1) Case of Measuring a Pattern Which Spread Over a Plurality of FOVs

In accompaniment with the microminiaturization of semiconductor devices in recent years, the request made for the measurement apparatus in the measurement accuracy and reproducibility has become more and more strict. With respect to a pattern which is becoming increasingly microminiaturized, more microscopic information needs to be acquired by narrowing the FOVs (i.e., heightening the magnification). On the other hand, narrowing the FOVs sometimes results in the case where the measurement target pattern cannot be involved within a single FOV.

Also, when evaluating for the doness of the pattern, in some cases, it is necessary to evaluate not only a single pattern but also its relationship with another pattern existing in proximity to the single pattern. Concretely, when a plurality of patterns are formed in proximity to each other, in some cases, it is necessary to evaluate modifications of the patterns caused by the proximate correction effect.

In view of the above-described problems, in the present embodiment, the introduction will be given below concerning the recipe generation technology for generating the following recipe: Namely, by superimposing a plurality of FOVs on each other to form a large FOV, this recipe allows formation of an image where a pattern so large as to extend off a single FOV can be displayed, or an image where the relative relationship between a plurality of patterns can be identified accurately.

Concretely, a large-region image can be formed as follows: The region of a measurement/inspection target (when performing the evaluation including an adjacent pattern, a region including the target pattern and the adjacent pattern) is determined. Next, with respect to the large region determined, a plurality of small field-of-views are calculated where the inspection target image can be photographed with a high accuracy. Finally, the large-region image can be formed by combining these small field-of-views (FOVs) with each other.

Figure 7:
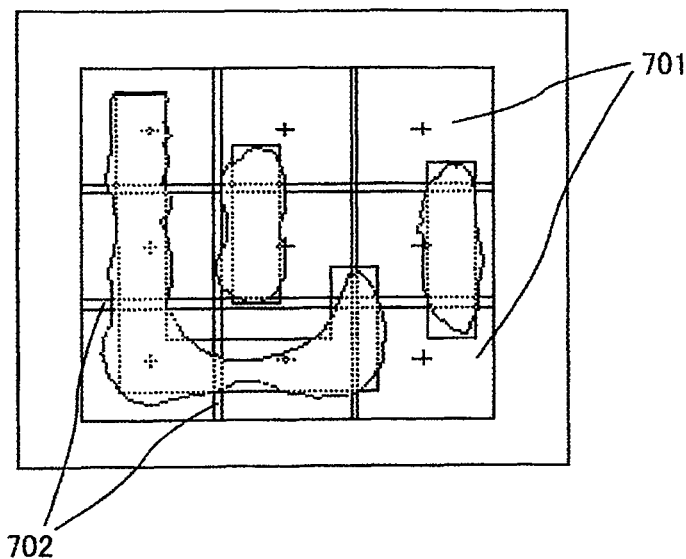
FIG. 7 is a diagram for explaining an embodiment where FOVs are acquired for establishing the connection by providing overlapped regions between FOVs.

Incidentally, in the present embodiment, the connectivity between the FOVs is taken into consideration. As a result of this, as illustrated in FIG. 7, size of the FOVs is determined such that the FOVs 701 are overlapped with each other. Since the equivalent configurations are represented in an overlapped portion 702, the accurate position alignment can be performed by, e.g., a pattern matching between these configurations. Furthermore, in the present embodiment, the contour-line conversion is performed with respect to the SEM edge, then performing the position alignment between the FOVs such that its line segments are overlapped with each other. This feature allows execution of the exceedingly-high-accuracy position alignment between the FOVs.

Also, as described earlier, the identification information is added to each contour line in the present embodiment. Accordingly, even in the case of, e.g., a sample where a plurality of same patterns are arranged, a side-by-side comparison of the identification information on each contour line is made between the adjacent FOVs. This execution of the side-by-side comparison makes it possible to implement the accurate superimposition between the FOVs while preventing a mix-up between the patterns. In particular, in each contour line used in the present embodiment, the identification information is added thereto based on the design data. Consequently, even in the case of different FOVs, the identification information on each contour line can be made common thereto as long as each contour line is of the same pattern. This allows implementation of the high-superimposition-accuracy-based superimposition between the FOVs without necessitating extra time and labor.

Also, if sizes of the individual FOVs are nonuniform, in the image after the superimposition, a variation in the measurement accuracy occurs for each location thereof. This situation requires that the photographing be performed with a uniform magnification for each FOV. Also, maintaining a stable length-measuring accuracy for a plurality of measurement targets requires that the images be acquired with the use of an identical magnification always. In the present embodiment, in view of the conditions like this, a proposal is made concerning a recipe setting method which makes it possible to address a change in size of the pattern by changing the number of the FOVs while keeping unchanged the size of each FOV capable of ensuring a desired measurement accuracy. Namely, when determining the acquisition number of the FOVs so that a desired measurement pattern will be involved therein, only the FOV acquisition number-of-pieces is automatically changed while keeping the size of each FOV unchanged in correspondence with the setting of the size of a region which involves the measurement pattern. In this way, by giving a higher priority to the determination of the size of each FOV, it becomes possible to stably maintain the measurement accuracy independently of the size of the pattern.

Also, a similar effect can also be obtained by changing the acquisition number-of-pieces and the size of the superimposition regions in correspondence with the size of the pattern. In this case, the acquisition number-of-pieces is determined so that a region involving the entire pattern will be involved. Simultaneously, it is advisable to change the size of the superimposition regions in order to adjust the size of the image to be formed.

Based on the references described so far, in the design-data management unit 33 or the control processor 30 explained in FIG. 5, the factors such as the image acquisition number-of-pieces and the size of the superimposition regions are determined automatically, then being stored into the recipe for controlling the scanning electron microscope. As described above, it is desirable to determine the size of each FOV in advance, and to determine the factors such as the image acquisition number-of-pieces and the size of the superimposition regions with the information on the size of each FOV used as the reference. If, however, there exists other circumstances to which a higher priority is to be given, changing the size of each FOV is executable.

(1-2) Case of Measuring and Observing a Certain Region Selectively with High Magnification In evaluating the finished quality of the semiconductor device, consider the following occasion: A simulation based on the design data is performed, and a sample involving a critical region where there is a possibility of occurrence of a defect or the like is measured and inspected based on this simulation result. On this occasion, in some cases, the more detailed measurement and observation is made regarding this critical region as compared with other regions. In order to automatically creating a recipe for measuring the sample like this, a proposal is made concerning an algorithm where the degree of risk obtained based on the simulation result is quantified on each measurement-region basis, and where the size of each FOV is automatically determined in accordance with the degree of risk thus quantified.

Figure 8:
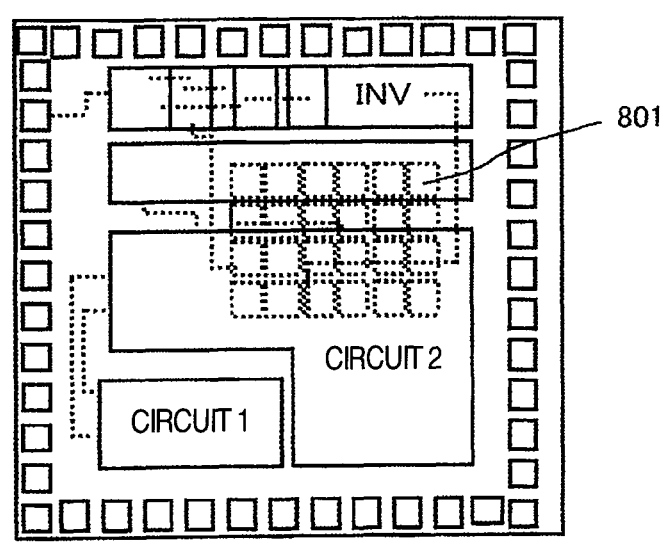
FIG. 8 is a diagram for explaining an embodiment where sizes of the FOVs are varied depending on degree of risk.

Namely, as illustrated in FIG. 8, each FOV is automatically determined as follows: The detailed measurement is made on a region 801 with a high degree of risk by using a small FOV; whereas the approximate measurement is made on an otherwise region by using a large FOV (not illustrated). Determining each FOV in accordance with the rule like this allows implementation of the determination of each FOV which makes it possible to establish mutual compatibility between the high measurement accuracy and an enhancement in the measurement efficiency. Incidentally, in quantifying the degree of risk, the various conditions on the formation of the semiconductor device are taken into consideration, and weights can be assigned to their coefficients in this way.

The factors such as the setting of size of the superimposition regions are automatically determined based on the rules explained in (1-1-1).

Figure 9:
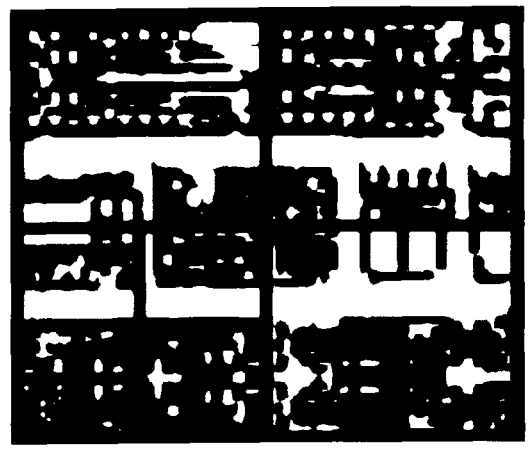
FIG. 9 is a diagram for explaining an embodiment where the FOVs are allocated in a hierarchical-structure-like configuration.

(1-3) Case of Determining FOVs with Circuit-Associated Meaning Taken into Consideration A large number of plural elements are formed on a semiconductor device. Of these elements, there exist elements which have a different meaning in circuit terms, such as gate unit of a transistor, gate extension unit thereof, intersection unit thereof with diffusion layer, polysilicon wiring thereof, diffusion sharing unit thereof with adjacent transistor, and the like. Accordingly, it is conceivable that the evaluation of the pattern is performed based on the design data and in each circuit unit. FIG. 9 is a diagram for explaining an embodiment where the FOVs are automatically set based on the design data and depending on the type of an arbitrarily set pattern. As illustrated in FIG. 9, each FOV is allocated in such a manner that each FOV involves the pattern selectively. Also, since the design data involves data on a circuit to which the pattern belongs, each FOV is allocated at an appropriate position based on selection of the circuit data, position of the pattern configuring the circuit, information on the configuration, and the size of a desired FOV set in advance.

Additionally, if the FOV in an appropriate size can be allocated from the circuit-associated importance and the measurement accuracy in view of the purpose of the measurement, it becomes possible to establish mutual compatibility between maintaining of the high measurement accuracy and efficiency implementation of the measurement. Consequently, in the present embodiment, a proposal is made concerning a method for classifying the regions on each circuit-type basis, and changing the size of a FOV to be applied on each region basis.

As an example, it is conceivable to set an algorithm for setting in advance the weights-assignment coefficients on each circuit-importance basis, and determining the size of each FOV in correspondence with the weights-assignment coefficients. For example, it is advisable to determine in advance the size of each FOV in correspondence with the set weights-assignment coefficients, and to set the number and positions of the FOVs so that a desired pattern or desired region will be involved therein.

Since the FOV in the same size is allocated to the circuits of the same type, it becomes possible to make the measurements based on the same accuracy.

Figure 10:
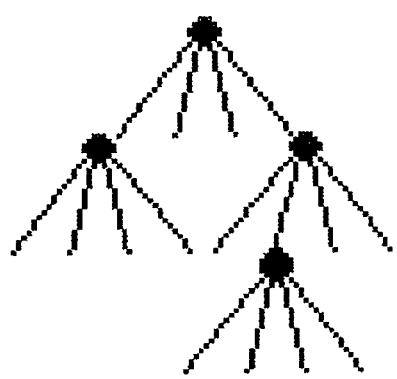
FIG. 10 is a diagram for explaining the hierarchical structure of the FOVs.

More concretely, an assembly of a plurality of transistors is evaluated in a circuit-associated unit, thereby being able to be also used for, e.g., characterization (i.e., characteristics evaluation of cell) of a standard cell or the like. FIG. 9 is the diagram for conceptually explaining the embodiment where the appropriate FOVs are allocated to the design data depending on the type of the circuit. Also, the allocation of the FOVs as illustrated in FIG. 9 is performed in a hierarchical structure illustrated in such a conceptual diagram as FIG. 10. The recipe is automatically set so that a low-magnification FOV is allocated to a location such as a mere wiring unit where high accuracy is not requested relatively, and so that a high-magnification FOV is allocated to an important location such as a transistor where performance of the semiconductor element is determined. Also, the low-magnification section is also used for the addressing.

In the meaning in circuit terms, the respective FOVs are classified into the locations of a transistor to be measured, i.e., the locations such as gate unit, gate extension unit, intersection unit with diffusion layer, polysilicon wiring, diffusion sharing unit with adjacent transistor, and the like. From the conditions on the measurement magnification calculated in advance from the design-rule with respect to this classification, each magnification, i.e., each FOV region, is determined and deployed automatically. Consequently, the recipe can be generated where the magnification differs depending on the differences in the patterns to be measured, and where the respective FOVs are overlapped with each other.

(2) Outline of Image Acquisition Unit

In the image acquisition unit, the images of the measurement/inspection target are sequentially acquired in accordance with the recipe generated by the recipe generation unit. An image for the alignment is acquired using the design data (which, hereinafter, will be referred to as "CAD (Computer Aided Design) data" as an example of the design data in some cases). Then, using this image, the positioning of the location is performed using the CAD data. Next, a high-magnification image of the measurement target position is acquired, then superimposing the CAD data on the high-magnification image. At this time, if an error occurs in the positioning in the high-magnification image, the matching of the CAD data is performed again to make the position correction. After that, the correspondence information on the acquired image with the CAD position is managed.

In the present embodiment, the images of the pattern which becomes the inspection target are acquired with a high accuracy, using the design data (e.g., GDS data) which becomes the original of the pattern fabrication.

Namely, since the image acquisition is performed based on the design data, there exists a one-to-one correspondence relationship between the inspection images and the design data. This correspondence relationship makes it possible to immediately determine to which position in the design data the image belongs.

Accordingly, inspecting the image makes it possible to judge, based on the design data, what type of influences the good-or-bad of the image exerts on the design (e.g., circuit performance and yield).

In this way, in the present inspection scheme, the image recording scheme which has the correspondence relationship with the design data is employed. This image recording scheme makes it facilitate to convert the contour line into the design data. This conversion of the contour line into the design data will be described later.

(3) Outline of Edge Detection Unit

In the edge detection unit, the edge representing the pattern is detected based on the acquired image acquired by the image acquisition unit. In this detection, a region for detecting the profile on each pixel basis is set with the line segments of the CAD data used as the reference. Then, the edge points are detected according to the edge detection scheme of the length-measuring SEM. At this time, in order to recognize a deformation of the pattern (i.e., pattern cut or short-circuit), the correspondence relationship between the corresponding portion and the CAD line segment is detected, then extracting the collapse. Moreover, an averaging processing is applied to the point string detected, thereby performing a smoothing as the contour line. In the edge detection unit, the following edge detection is performed.

(3-1) Edge Detection Based on Line-Profile Formation

Figure 11:
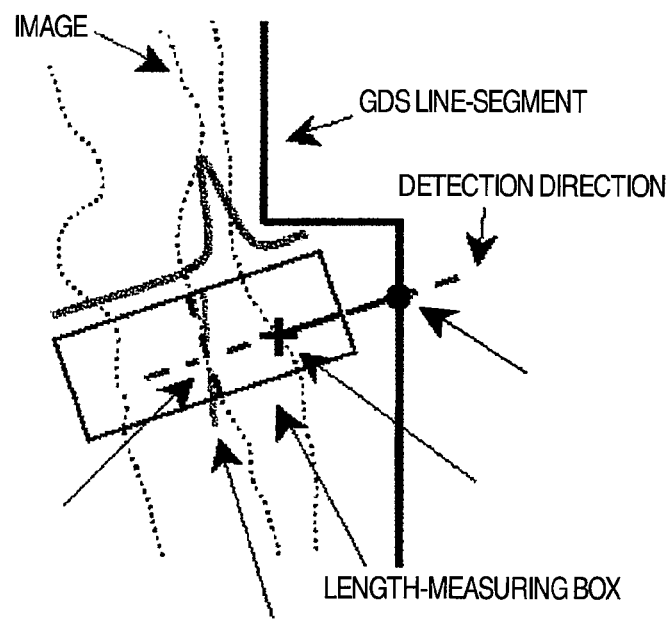
FIG. 11 is a diagram for explaining the principle of the contour-line formation.

Hereinafter, the explanation will be given below regarding a method of extracting the SEM edge from a line profile (which, hereinafter, will be referred to as merely "profile" in some cases) obtained by the electron-beam scanning), and performing the line-segment conversion (which is referred to as "contour-line conversion" in some cases) of the SEM edge. The contour line in the present embodiment is formed in accordance with the following steps:

1) An approximate contour line is formed, using an image processing. In this case, as illustrated in, e.g., FIG. 11, the image processing is performed whereby the line segments will be formed along the white band of the SEM edge.

2) A length-measuring box is set so that pixels which form the line segment will be involved in the box. The profile is formed by scanning the electron beam inside the set length-measuring box. Also, the length-measuring boxes are set in an arbitrary number along the formation direction of the contour line. The formation direction of the profile is determined using the design data as the original, and based on a prediction of the transfer of the actual pattern.

3) The profile calculation is performed inside the length-measuring boxes, thereby selecting the line-segment-converted edge points accurately. Then, the contour line is formed in such a manner that the edge points are mutually connected to each other. In this case, peak positions of the formed line profile, or the profile positions equivalent to a predetermined luminance threshold value (Th) are selected, then being defined as the edge points.

(3-2) Noise Elimination Processing at the Time of Edge Detection

Figure 12:
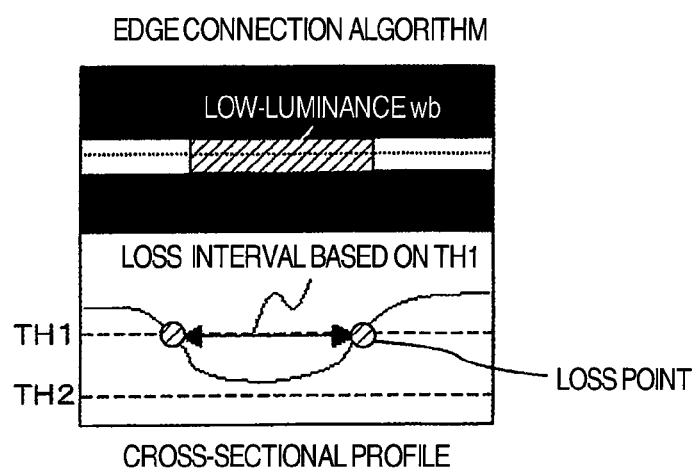
FIG. 12 is a diagram for explaining an edge-connecting algorithm.

When the contour-line conversion is performed, the edge information on the original image is sometimes lost. As a result, in some cases, the appropriate contour-line conversion becomes difficult. Hereinafter, based on the illustration in FIG. 12, the explanation will be given below concerning steps for connecting such edge points to each other appropriately.

1) First, the white band of the image which configures the edge is detected.

2) After the two-valued conversion is performed with a threshold value 1 (Th1), the narrow-line conversion of the edge is carried out (noise is small).

3) After the two-valued conversion is performed with a threshold value 2 (Th2), the narrow-line conversion of the edge is carried out (noise is large).

4) Portions where the edge is judged to be lost with Th1, and where the edge is judged to exist with Th2 are detected as being loss points.

5) The edge existence ratio is detected in the loss-point interval.

6) If the edge existence ratio is larger than a constant value, the loss points are connected to each other.

Performing the processing as described above allows implementation of the appropriate connection of the loss-point interval.

(3-3) Elimination Processing of Beard-Like Noise

Figure 13:
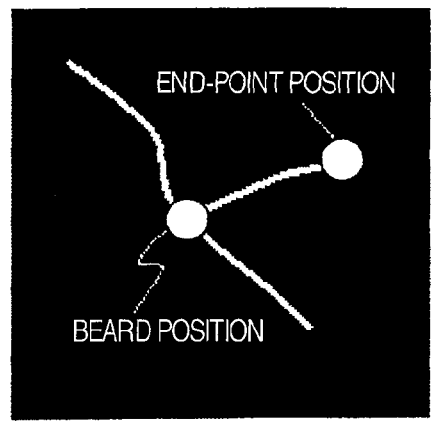
FIG. 13 is a diagram for explaining a beard-eliminating algorithm.

When the edge detection is performed, as illustrated in FIG. 13, a line segment which extends from the edge just like a beard occurs in some cases, despite the fact that this phenomenon is not directly related with the edge. Hereinafter, the explanation will be given below regarding steps for eliminating the noise like this.

1) First, the narrow-line conversion of the SEM edge is performed.

2) The beard position is detected by the template processing.

3) The end-point position is detected by the template processing.

4) A pixel signal between the beard position and the end-point position is eliminated, thereby performing the elimination of the beard portion.

(3-4) Concrete Pattern-Collapse Judgment

In the edge detection for the purpose of implementing the contour-line generation, it is necessary to recognize a configuration collapse of the pattern corresponding to the design data (i.e., pattern whose configuration does not coincide with the design data).

In the present method, the profile calculation on each pixel basis is performed where the design data is used as the reference. Accordingly, in the case of a pattern which is significantly retreated or expanded with respect to the design data, or in the case of a division configuration or connection configuration which differs from the design data, the distance between the line segments, which are the design data, and the edge points, which are employed as the target, is comparatively large. As a result, in some cases, the accurate profile calculation becomes impossible, and thus the accurate contour-line construction becomes impossible.

In the present method, in order to solve these problems, optimization of the edge detection is implemented by performing the following processings:

1) Calculating an approximate contour line is performed in the above-described noise elimination and loss elimination processes, using the image processing. At this time, a rough contour configuration is determined based on the judgment on a general signal amount on each pixel basis.

2) The correspondence relationship is determined between the above-described approximate contour line and the line segments of the design data corresponding to the proximity. In this way, a classification is made regarding the retreat or expansion due to the difference in the distance, and the division or connection which does not correspond to the line segments of the design data.

3) With respect to the accurate edge detection of the pattern-collapse portion, from the above-described classification, the position of a profile calculation region is defined as the approximate edge position. In this way, the optimization of the profile calculation region is performed.

(3-5) Case of Forming Contour Line by Processing Line Segments not Existing in Design Data In the transferred pattern on a semiconductor wafer, planarization of the plane or surface (i.e., CMP (: Chemical Mechanical Polishing) processing) needs to be performed in order to maintain the fabrication yield highly. On account of this, in the wiring region or the like, in many cases, a dummy wiring pattern which does not function as the wiring pattern is transferred to a region of loose wiring pattern, depending on the degree of congestion of the wiring (i.e., dummy film). Since this pattern is not the pattern which configures the circuit, it does not exist as the design data generally. Also, since this pattern is designed for the purpose of filling the loose region, it is embedded in a configuration which is larger than the wiring pattern as the circuit. In the present contour-line extraction, a processing is performed where the dummy pattern like this larger than the wiring pattern is excluded from the extraction targets based on the design rule.

Also, in recent years, automatic generation of the dummy pattern has become increasingly executable in the design automatization processing (EDA (: Electronic Design Automation)) by performing a simulation on the planarization processing based on the wiring density.

Consequently, in the present contour-line extraction processing, if there exists the data used for the above-described dummy-pattern generation, the dummy pattern and the actual pattern are caused to correspond to each other by making reference to this configuration data. In this way, recognizing the dummy pattern is performed, thereby making it possible to exclude the dummy pattern from the contour-line extraction.

(3-6) Addition of Identification Information to Multilayered Contour Line

In the semiconductor fabrication processes, finished qualities of the elements and wiring exist as inspection target patterns on each process basis.

Figure 14:
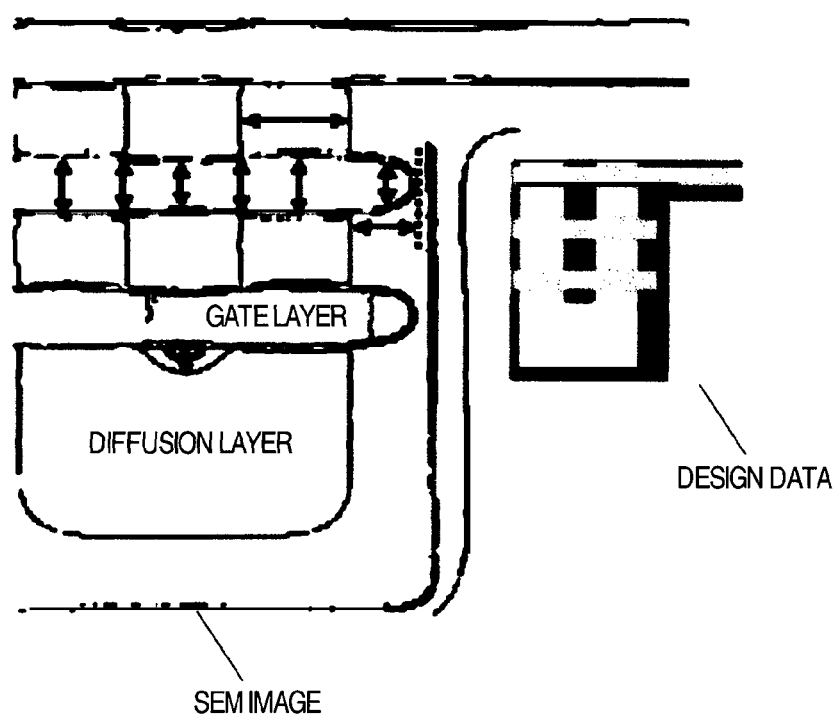
FIG. 14 is a diagram for explaining a wiring layer of multilayered structure.

For example, as illustrated in FIG. 14, a diffusion region and a gate pattern exist as transfer patterns directly after the gate fabrication process of a transistor. Also, in the wiring process in each later, pattern of the wiring layer and contact pattern exist in a mixed manner.

In the processing of the edge detection in the contour-line extraction, the correspondence relationship with the design data, which is designed for each later which becomes the target, is calculated. This calculation makes it possible to identify whether the edge is the diffusion-region pattern or the gate-layer pattern, thereby allowing the edge points to be classified in correspondence with the design data in each later. On account of this, as the above-described identification information for the line segments, it is advisable to add the layer information together therewith.

This layer information makes it possible to exclude the diffusion-region pattern and to extract a contour line for performing an inspection of the gate layer alone, or makes it possible to inspect both the diffusion layer and the gate layer simultaneously.

(4) Outline of Configuration-Conversion/GDS Generation Unit

In the configuration-conversion/GDS generation unit, the correspondence relationship between the respective edge points detected and the corresponding CAD-data line segments is calculated. The string of these points is sorted for each CAD-data line segment, then converting the sorted points into a closed polygon in such a manner as to become a continuous unicursal.

Using this result, a cell structure as GDS data is generated on each FOV basis. Also, this cell is deployed in the coordinate space on the design data, thereby representing, as the GDS, the contour-line data corresponding to the hierarchical design data.

The high-accuracy contour-line configuration extracted from the inspection target has the correspondence relationship with the design data which became the original of the pattern's fabrication. As a result, by representing the contour-line configuration in the same scheme as that of the GDS, i.e., the scheme of the design data, various utilizations of the contour-line configuration become implementable.

By representing the contour line of the pattern configuration by using the design data having the hierarchical structure, it becomes possible to represent the contour line in such a manner that the contour line is in the correspondence relationship with the structure of the design data on the circuit. This feature allows the good-or-bad of the verification result on the contour line to be directly reflected on the design data, thereby making it possible to confirm, predict, and amend the design data. Accordingly, it becomes possible to address a design unsuccessfulness more swiftly.

Also, by representing the pattern configuration as the contour-line-converted GDS, integration with the design data becomes implementable. Accordingly, the design data and the configuration of the fabrication pattern resulting therefrom can be managed in the same environment. Consequently, the design data and the fabrication pattern can be confirmed simultaneously. This simultaneous confirmation allows an optimum design for the fabrication to be easily implemented in the design process (i.e., data amendment or the like).

Also, by converting the pattern configuration into the GDS, the data processing by the respective types of EDA general-purpose tools becomes easier to execute. Consequently, the EDA processing becomes implementable where the pattern configuration is dealt with in the same way as the design data.

Also, by representing the pattern configuration as the hierarchical GDS, the hierarchical-GDS pattern is deployed on the design layout in a manner of being caused to correspond to each other. This deployment makes it easier to generate a panorama configuration on which the FOVs in the respective measurement regions are pasted, thereby allowing implementation of respective types of pattern verifications in a wide range.

(4-1) Integration of SEM Image with Design Data by Predetermined-Format Conversion Hereinafter, the explanation will be given below regarding the following embodiment: The contour line of the pattern configuration from a pattern or a mask image on the wafer which becomes the inspection target is converted into a predetermined format (GDS format in the present embodiment), then being managed as graphics data.

The integration of the circuit and layout and library, the integration with the measurement recipe (i.e., wide range, adjacent FOV), the hierarchy-converted representation, or the recipe linked with the design structure, and contour-line D/B management are performed, and these factors are formed into integrated and managed data. This formation makes it possible to make full use of the following respective types of EDA systems:

(4-1-1) Data Processing by Respective Types of EDA General-Purpose Tools

By converting the inspection-target pattern into the GDS as the contour line, the pattern becomes processable by the already-existing automatization system of semiconductor design.

Namely, in the design environment, graphics is used as the design data which represents a semiconductor pattern. This graphics is schematically used as the semiconductor transfer pattern. In this way, the processings are performed in a pseudo manner by the respective types of verifications and analysis software.

The contour line of an inspection-target pattern obtained by the present method is processed as the accurate semiconductor pattern by the respective types of verifications and analysis software. This processing allows implementation of the high-accuracy verifications and analyses, thereby making it possible to promote the optimization of construction of the design environment in which the fabrication facilitation in the design process is taken into consideration.

(4-1-2) Pasting Technology of a Plurality of FOVs by Using Design Data (i.e., Panorama-Image Generation)

In order to accomplish the high-accuracy Implementation, the contour line of an inspection-target pattern needs to be formed based on an image which is acquired with such a high magnification as one-million times to two-million times. Accordingly, its FOV is an extremely narrow region.

On the other hand, inspecting a wide region is desirable from the viewpoint of the position relationship with adjacent pattern and the configuration dependence.

In the present embodiment, in order to measure and inspect a wide region with an accuracy which is almost equal to the one of an image acquired with a high magnification, the introduction will be give below concerning a technology of forming a wide-region contour line by mutually connecting a plurality of FOVs to each other.

Concretely, as was explained in (1), by forming a wide-region contour-line image by mutually connecting images acquired with a high magnification to each other, it becomes possible to measure and inspect the wide region with a high accuracy. Also, by making a relative position adjustment between the FOVs in such a manner that the contour lines formed based on the luminance information are overlapped with each other, it becomes possible to form an exceedingly-high-accuracy large-region contour-line image.

Also, the identification information is added to each contour line which constitutes each side, then being used for the verification at the time of the superimposition. As a result of this, even if similar patterns are adjacent o each other, it becomes possible to implement the accurate superimposition between the FOVs without mixing up the similar patterns.

(4-2) Outline of GDS-File Conversion of Contour Line

Figure 15:
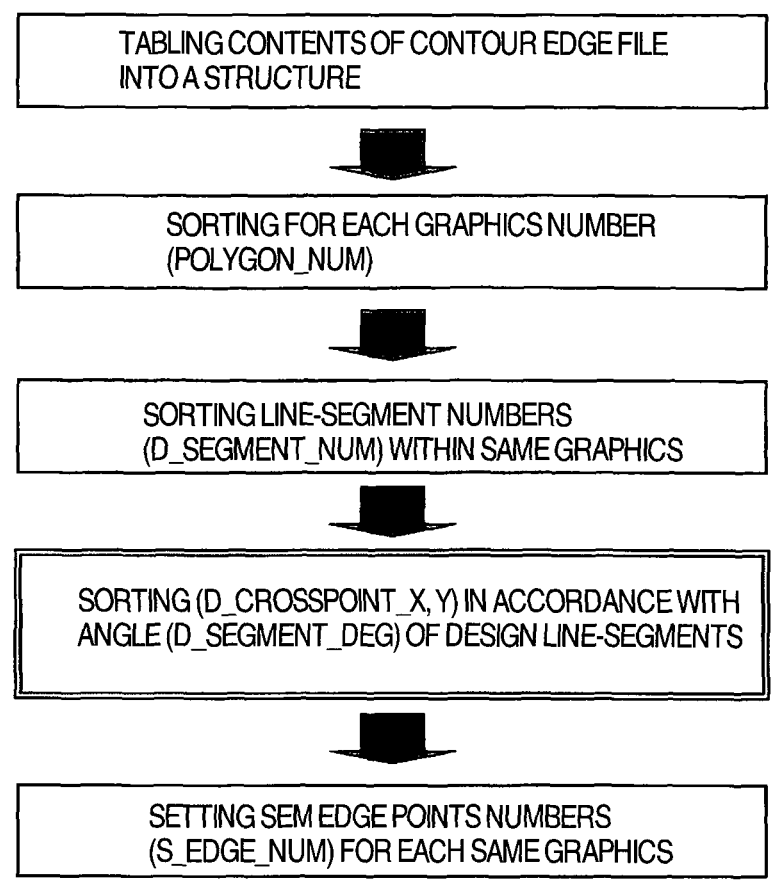
FIG. 15 is a flowchart for indicating procedure steps of converting the contour line into a GDS file.

FIG. 15 is a flowchart for explaining processes of converting, into a GDS file, the contour line determined from the SEM edge. The contents of the D/B of the detected edge are converted into a memory structure for the contour-line conversion processing.

This memory structure stores therein information such as the detected edge obtained at the time of the image acquisition using the design data, design graphics line-segments, and superimposition correction coefficient. Here, the correspondence relationships (i.e., distance and angle) between the respective design graphics line-segments and the detected edge points are determined, using these pieces of information.

This memory structure stores therein all of the line segments of the design graphics of the field-of-view (FOV) corresponding to one image acquisition. In the above-described processing, all of the edge points and all of the graphics line-segments are caused to correspond to each other. The same number is allocated to these line segments as the graphics number on each closed-polygon basis. After the above-described establishment of the correspondence relationships between the edge points and the line segments is terminated, the respective line segments are sorted on each graphics basis.

Next, a plurality of line-segment groups represented by one graphics number are sorted based on the line-segment number. This sorting specifies an arrangement of the respective line segments in accordance with the sequence of respective vertex points which configure one closed polygon. As this arrangement, a clockwise direction and a counterclockwise direction exist in a two-dimensional coordinate space.

The following point characterizes the representation by this rule: The case where the inner side of the graphics represented by the closed polygon indicates the area (i.e., the pattern portion as semiconductor) is defined as the clockwise direction. Contrary thereto, the case where the outer side of the graphics resented by the closed polygon indicates the area is defined as the counterclockwise direction.

As a consequence of the above-described sorting on each line-segment basis within the graphics, the sorting of the respective edge points corresponding to each line segment (i.e., direction of the vertex-points string of the design graphics) is executable. The sorting of the edge points is performed which is caused to correspond to this direction (i.e., clockwise direction or counterclockwise direction) on each line-segment basis.

As a consequence of the above-described sorting, the respective edge points are generated which correspond to the respective design graphics line-segments on each design graphics line-segment basis which configure the closed polygon. Accordingly, the contour-line configuration representing the closed polygon can be generated finally. Also, in some cases, the contour-line configuration of the photographed image is cut off by the field-of-view (FOV) frame. In this case, clipping of the contour line by the FOV is performed, thereby converting the edge points into the closed polygon.

(4-3) Outline of Sampling Density (i.e., Configuration Stabilization)

When the contour line is generated in the coordinate space of the design data using the edge points extracted from the image, a difference generally occurs in the resolution between pixels within the field-of-view of the image and the coordinate space of the design data.

For example, if the pixel resolution of the image photographed with a magnification of twelve hundred thousand times is equal to 512 pixels, one pixel is equivalent to 2 to 3 nm.

Accordingly, if the contour line is represented in the coordinate space of the design data with this resolution, it turns out that the contour line is mapped into the coordinate space of a 2-to-3-nm unit. Consequently, the spacing therebetween is connected by a straight line, which causes an error to occur. Since the resolution of the design data can generally be represented in 0.1 nm to 1.0 nm, there exists the need of representing the contour-line configuration approximately with this resolution.

Figure 16:
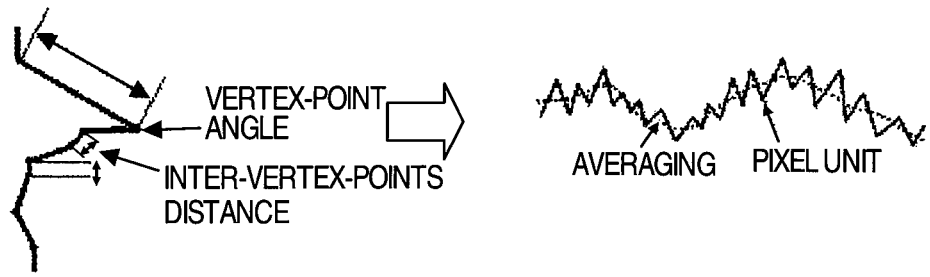
FIG. 16 is a conceptual diagram of the smoothing processing for the contour line.

In the present technique, as illustrated in FIG. 16, after the contour-line conversion is performed based on each coordinate position, a threshold value for averaging the respective vertex points is determined. Then, the smoothing is performed with this threshold value used as the reference.

(4-4) Parallel Processing

In the present technique, for the purpose of constructing the high-accuracy contour-line configuration in a wide-region photographing range, the scheme is employed where the wide region is photographed such that the wide region is divided into high-magnification field-of-views (FOVs).

Figure 17:
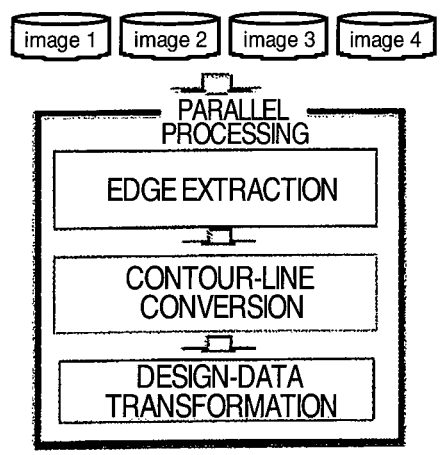
FIG. 17 is a diagram for explaining an embodiment where the contour-line conversion processing is performed in parallel.

As a consequence of these factors, the above-described contour-line conversion processing becomes executable independently in a unit of the acquired images. Accordingly, each resultant contour-line conversion processing becomes executable by mutually-independent processing apparatuses. Namely, the parallel processing as illustrated in FIG. 17 becomes implementable. This parallel processing is characterized by a data structure and a processing scheme which allow implementation of the high-speed processing proportional to the number of the processing apparatuses.

Namely, the processings on each FOV basis are paralleled. In order to construct the final wide-region contour-line configuration, deployment coordinates of the respective FOVs are used which exist on the wide-region design data used in the measurement. The use of the deployment coordinates makes it possible to construct the hierarchy-structured design data accurately.

(4-5) Hierarchy-Formation Processing of Contour Line

Figure 18:
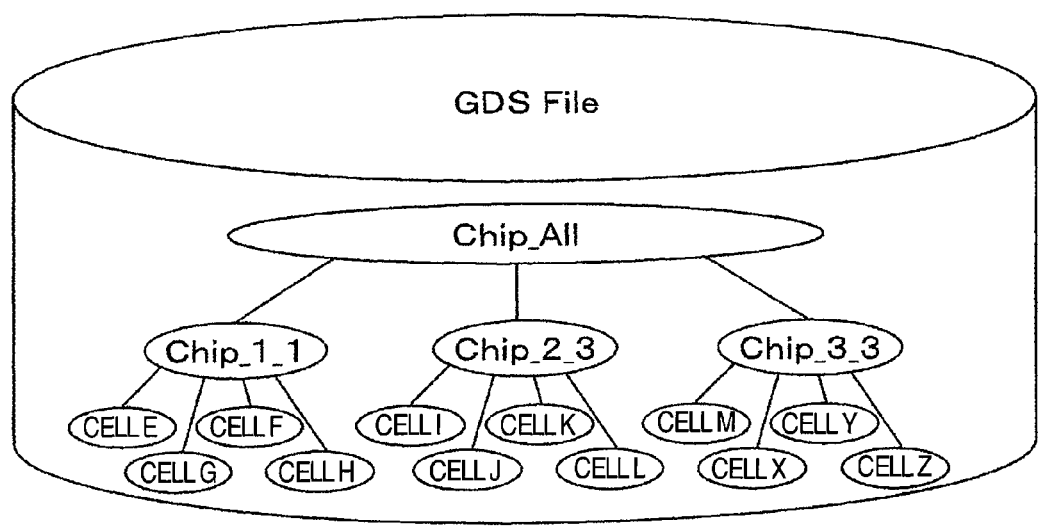
FIG. 18 is a diagram for explaining an embodiment where the contour-line formation is managed in a cell unit.

Hereinafter, the explanation will be given below regarding an embodiment where the contour-line-converted SEM edge is managed in a cell unit equivalently to the design data. FIG. 18 is a conceptual diagram of such a data structure.

In the present technique, the contour-line configuration on each field-of-view basis can be represented as the cell, i.e., the unit of the design data. The design data line-segments used at the time of the image acquisition, and graphics of the other layers (graphics of layers of wiring layer, contact layer, and the like) on the design related with the line segments can be stored into this cell in a manner of being overlapped with each other.

This makes it possible to manage the design data and the contour-line configuration as one cell. Namely, the semiconductor transfer configuration and the design data which became its original can be managed as the same data.

Also, in the recipe used for the photographing, the position in each measurement is represented as the position on the chip, i.e., the coordinate system of the design. Consequently, by deploying the above-described FOV cells at the positions on the chip hierarchically, it becomes possible to deal with the FOV cells as the pattern contour configuration on the chip.

Moreover, in the photographing recipe, the image acquisition is performed by describing a photographing condition of a plurality of chips on the wafer. Accordingly, the design data can be created where the chips on which the contour lines are deployed are deployed as the wafer coordinate system.

Also, based on the above-described data structure, the contour-line configuration of a plurality of wafers can be formed into the hierarchical structure as the GDS. This makes it possible to implement the unified management of the contour-line configuration as the data ranging from the element level to the lot level, thereby allowing the pattern configuration to be made full use of in the respective types of yield analyses and statistical managements.

(4-6) Panorama-Conversion Processing of Contour Lines

In the above-described contour-line generation technology, as described earlier, it is possible to construct the large-region panorama contour line which is constructed by combining and deploying the contour lines of the respective FOVs in accordance with the panorama-image acquisition recipe and the design-data representation of the contour lines (i.e., GDS conversion or the like).

In generating the panorama contour line, the following correction is made regarding the contour-line connection between the FOVs, thereby implementing the high-accuracy panorama contour-line generation.

(4-6-1) Correction of Connection Portion Between FOVs (Overlapping Direction of FOVs)

In the contour-line extraction of each FOV, in a proximity to the FOV boundary, the accuracy of the image for the contour-line detection is low due to the property of an electron beam at the time of the image acquisition. As a result, the extracted contour lines lack reliability in some cases.

In the technology introduced in this column, in the contour-line connection processing in a proximity to the FOV boundary, an overlapped amount of the contour lines in the boundary portion is detected from the overlapped images of the FOVs optimized by the recipe at the time of the photographing. Then, coordinates of the overlapped portions are corrected based on the overlapped amount detected, thereby correcting the accuracy of the contour-line generation in the FOV boundary portion.

(4-6-2) Connection Between Contour Lines

When deploying the contour line of each FOV into its higher-order hierarchy, the deployment is performed using the coordinates (i.e., coordinates at which the FOV should be deployed) of the design data managed by the photographing recipe described earlier.

On account of this, the coordinates are represented by the design-data coordinate system. Accordingly, it turns out that, when the design data (graphics) of each FOV is deployed, the connection between the FOVs is established accurately.

Due to the property of the electron beam, however there is a possibility that a several-pixel shift occurs in the position of the contour line within each FOV acquired by the image acquisition. Consequently, in some cases, a several-nanometer shift occurs resultantly in the contour line deployed into the higher-order hierarchy.

In the present technique, in addition to the above-described correction in the overlapping direction, the subtle shift between the contour lines in the overlapped portions is corrected with a difference with the design data used as the parameter.

Namely, a difference is calculated between the contour line existing in one of the overlapped portions of the FOVs and the line segments of the design data corresponding to the contour line. Similarly, a difference is also calculated between the contour line in the other overlapped portion and the corresponding region. Then, the correction is made so that the respective differences become equal to each other. Moreover, based on its correction amount, the coordinates configuring the contour lines are corrected.

Next, this correction is made with respect to the up-and-down and right-to-left FOVs which are adjacent to the FOVs in question, respectively, thereby making the two-dimensional coordinate correction. As a consequence, the contour lines in the adjacent FOVs can be connected to each other accurately.

(4-6-3) Grouping of Closed Polygon

In the panorama contour line, when one closed polygon is represented as the contour line, the closed polygon is represented by the coordinate system of the design data. As a result, its configuration coordinate-points string becomes an enormous one. Accordingly, in some cases, the string exceeds a limit which can be represented as the design data (such as GDS).

Also, even within the range of the limit, when processing the configuration coordinate-points string in the contour-line processing application systems the representative of which is the EDA tool, it becomes necessary to process the string in such a manner that the string is divided. This is because the configuration coordinate-points string is the enormous one.

With respect to the case like this, in the present technique, the contour line configuring the closed polygon on the FOV boundary can be divided so as to be formed into the closed polygon. In this case, the same group number (graphics number) is added to one divided contour line which spreads across between the FOVs. This group number allows the application systems to recognize that the contour line is the same divided contour line.

Incidentally, because of the division of the contour line, a line segment (segment of FOV) which does not exist originally in the pattern occurs in the divided contour line. This line segment is recognized by the application systems from the presence or absence of the addition of the above-described group number and the FOV boundary information, then being able to be processed (i.e., eliminated if required).

For example, in an application of the OPC model correction where a comparatively wide region is employed as its target, this divided line segment is recognized by the system of the OPC processing portion. This recognition makes it possible to easily reconstruct the contour line as the closed polygon.

Also, if the electrical connection is represented by a single layer such as the wiring pattern, recognizing the above-described group number makes it possible to represent equipotential between the patterns.

When short-circuit between patterns at the judgment on the short-circuit detection of a pattern, this representation of the equipotential is usable for an application such as neglecting a short-circuit pattern at the same potential.

(5) Concerning Outline of GDS Utilization Unit

The GDS utilization unit performs respective types of verifications, using the contour line formed as described above. These verifications are as follows:

(5-1) OPC Simulation by Contour-Line Conversion of Mask Configuration

Hereinafter, the explanation will be given below regarding an embodiment where the high-accuracy OPC (: Optical Proximity Correction) simulation is performed based on the contour-line conversion of a semiconductor mask configuration.

The OPC simulation is as follows: The optical proximity effect is expected, and a pattern for correcting this effect is formed using the design data, i.e., a mask pattern, or mask data which becomes an original of the mask fabrication.

In accompaniment with the progress in the micromachining, however, a difference between the design data and an actually-produced mask configuration is becoming more and more conspicuous. As a result, an error in the simulation has become significant, and thus the optimum correction is becoming increasingly difficult to make.

In view of this situation, the exceedingly-high-accuracy contour line of the mask configuration generated by the present technique is used as the data for the simulation. This method makes it possible to accomplish basically the same accuracy as the one of the simulation using the actual mask configuration, thereby allowing implementation of the high-accuracy OPC model correction and model verification.

Also, the contour-line data in the present technique is represented with the GDS or the like as the scheme of the design data. This representation allows the conventional simulation environment to be made full use of with no modification added thereto.

Furthermore, the contour line of the mask configuration, the contour line obtained as a result of the OPC simulation, and the pattern contour line transferred onto the wafer pattern are superimposed on each other as the design data. This superimposition allows implementation of the high-accuracy verification on the fabrication facilitation of the design data.

(5-2) CAA

There exists a simulation technology of analyzing the design data, calculating correlation in defect size with respect to the pattern density (i.e., wiring width and wiring spacing), and anticipating a critical area for the defect in layout (hereinafter, this simulation technology will be referred to as "CAA").

Instead of the design data, the CAA calculation is performed using the contour-line configuration extracted by the present technique. This allows implementation of the accurate yield prediction and calculation of the correlation with the defect size.

(5-3) Model High-Accuracy Correction of Circuit Library

As the circuit performance simulation (mainly Tr element), Spice has been generally used from conventionally.

Consider a case where the operation model is defined in a pseudo manner by using resistance value and capacity value calculated from the design data, and where the model correction is made by generating and actually measuring the test circuit. This case is a task which necessitates exceedingly extra time and labor. Simultaneously, acquirable measurement data is small in amount, which has made it difficult to enhance the accuracy.

Also, regarding the standard cell (Stdcell) used in ASIC or the like, there occurs the necessity for compensation for the strict electrical characteristics (i.e., characterization of cell) of the cell (DFM library) for implementing the manufacturing facilitation design (DFM library) in recent years. The use of the contour line which represents the high-accuracy pattern configuration allows the high-accuracy implementations of not only the Tr characteristics within the cell, but also the electrical parameters such as the resistance value and capacity value of the wiring.

In particular, by presenting sheet resistance (Rs) which allows the recognition in the wiring's length direction represented by the design data, it becomes possible to implement higher-accuracy wiring resistance extraction (LPE). As a result, back annotate to the cell library becomes executable.

The following are the main usages which can be optimized by reproducing the actual device configuration using the high-accuracy contour line in the present technique: 1) the characterization of the DFM library, 2) prediction of leakage current at the Tr gate, 3) physical parameter extraction for Signal Integrity→crosstalk and IR drop, 4) reliability verification→antenna effect, electro migration, hot electron, 5) physical wiring length→strict delay parameter for circuit simulator (timing verification).

(5-4) Pattern Finished-Quality Inspection and Defect Inspection

By reproducing the pattern configuration as the design data with a high accuracy, it becomes possible to use the programs such as DRC (: design rule check) and ERC (: electrical connectivity check).

Figure 19:
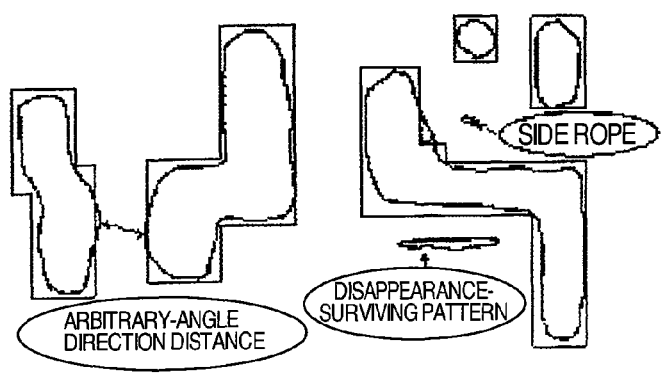
FIG. 19 is a diagram for explaining an embodiment where inter-contour-line spacing is measured in an arbitrary direction.

Also, as illustrated in FIG. 19, the contour lines represent the two-dimensional configuration. Accordingly, the pattern check can be made regarding the wiring spacing and wiring width in an arbitrary angle direction (i.e., oblique direction) other than the horizontal and vertical directions. This makes it possible to evaluate finished quality of the actual pattern configuration, thereby allowing execution of the high-accuracy verification of the pattern.

Also, in the present technique, the technique of the "pattern-collapse recognition" described earlier makes it possible to detect a residual pattern such as SRAF or side rope which does not exist in the design data, and to judge the disappearance-surviving pattern as an abnormal pattern. Consequently, this judgment is usable for the inspection of a pattern abnormality within the field-of-view.

(5-5) GDS-Based Length Measurement and Superimposition Display

Figure 20:
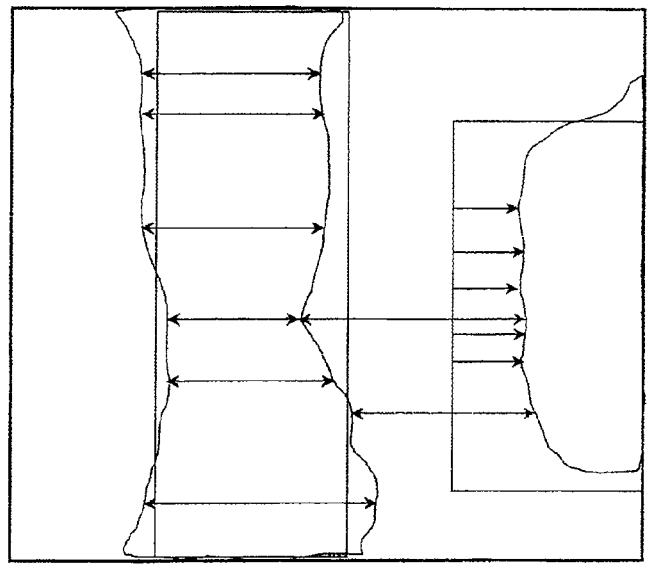
FIG. 20 is a diagram for explaining an embodiment where the GDS data is displayed on the design information.

As illustrated in FIG. 20, the GDS data which represents the contour line generated in the present technique can be displayed on a CAD display device.

This display allows the high-accuracy silicon pattern configuration or mask configuration to be displayed in a manner of being superimposed on the design data which became the original of these configurations. In particular, by performing the superimposition display of the respective contour-line configurations of the design data, the mask, and the silicon pattern, it becomes possible to perform the high-speed visual-check evaluation where the correlation relationship among them is taken into consideration.

Also, by measuring coordinate values of the contour line on the CAD display device, it becomes possible to make the length measurement easily on the CAD display device without using the length-measuring SEM.

Also, by performing the superimposition display of the image data which became the original of the contour-line generation and the above-described configurations, it becomes possible to easily make the evaluation of the correlation relationship between the image of pattern configuration and the design data.

Moreover, when the identification information is added to each line segment of the SEM edge on the basis of the design data, information on each line segment at the time when the pattern is grasped as a closed graphics is added as the identification information. The addition of this information makes it possible to facilitate the setting of measurement locations.

Figure 21:
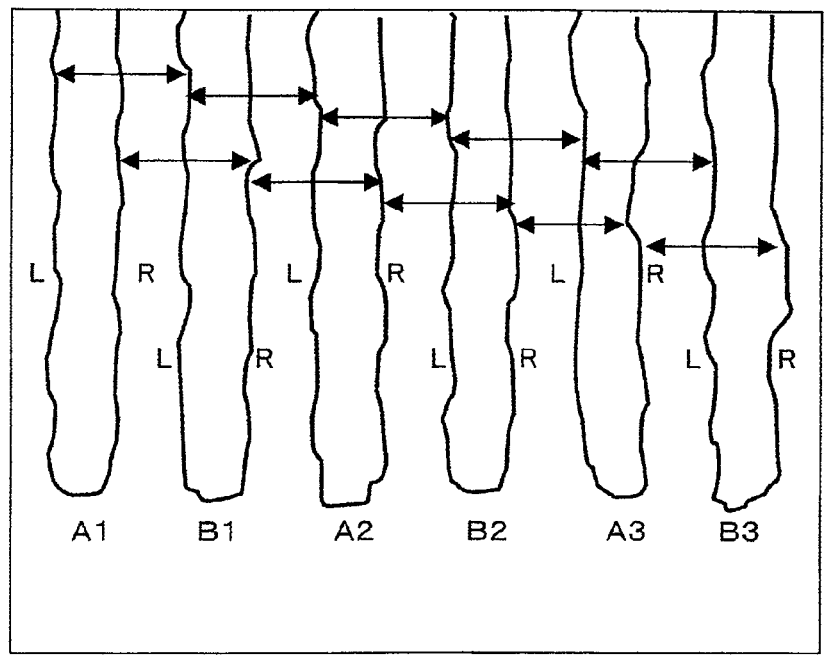
FIG. 21 is a diagram for explaining an embodiment of a pattern formed by DPT.

Hereinafter, referring to FIG. 21, the explanation will be given below concerning a concrete embodiment of this information. FIG. 21 illustrates a state where a plurality of equivalent line patterns are arranged within the FOV. In recent years, the technology referred to as "DPT (: Double Patterning Technology)" is becoming more and more employed.

This technology is a type of exposure technologies using an optical exposure apparatus (which, hereinafter, will be referred to as "stepper" in some cases). In this technology, the exposure processing is performed in a manner of being divided into two times, thereby allowing the pattern formation of a sample which has an inter-pattern spacing incapable of being exposed by one-time exposure.

The embodiment in FIG. 21 indicates the data obtained based on the electron microscope image of a sample which lies in a state where a first-time-exposed pattern (A) and a second-time-exposed pattern (B) are arranged alternately. In this data, identification information (L, R) is added to each line segment (only the right-and-left information on the line patterns in the present embodiment). Also, information (A1, B1, A2, B2, . . . m in the present embodiment) for identifying each line is added thereto. Namely, each line segment can be identified from another line segment by co-using the identification information for identifying each line and the identification information for identifying the position of each line segment within each line.

By adding the identification information like these to each line segment, it becomes possible to facilitate the setting of measurement locations to be used in the measurement of a semiconductor device, such as, e.g., pattern width, pattern pitch, and inter-space interval. Also, if a measurement result is judged to be obviously different and apart from the corresponding ideal value, the setting of making re-measurement or more-detailed measurement on the corresponding location is easily implementable.

It should be further understood by those skilled in the art that although the foregoing description has been made on embodiments of the invention, the invention is not limited thereto and various changes and modifications may be made without departing from the sprite of the invention and the scope of the appended claims.

The invention claimed is:

1. A non-transitory computer readable storage medium storing a program to be executed by a computer for carrying out image processing of an image obtained by scanning electron microscope for generating the image in accordance with electrons obtained by scanning electrons on a sample;
   wherein said program runs said computer for adding identification information to each of a plurality of fragments which constitute a pattern within said image acquired by said scanning electron microscope, said identification information being added to each fragment for distinguishing one fragment from another fragment.

2. The computer readable storage medium according to claim 1, wherein said program runs said computer to add said identification information to each fragment based on design data on said sample.

3. The computer readable storage medium according to claim 1, wherein said program runs said computer to determine clock-wise or counter-clockwise sequence of each fragment in accordance with the identification information added to each fragment.

4. The computer readable storage medium according to claim 1, wherein said program runs said computer to execute coordination between each fragment and a line segment of a pattern of design data of said sample.

5. The computer readable storage medium according to claim 4, wherein said program runs said computer to generate a closed graphic showing contour line of said pattern in accordance with each said fragment of which coordination with said design data is carried out.

6. The computer readable storage medium according to claim 5, wherein said program runs said computer to apply a field of view of said scanning electron microscope as a part of said closed graphic, when a part of said closed graphic existed out of field of view of said scanning electron microscope.

7. The computer readable storage medium according to claim 1, in combination with a pattern image generating apparatus equipped with said computer.

8. A non-transitory computer readable storage medium storing a program to be executed by computer for setting a field of view of a scanning electron microscope into a plurality of positions and for generating recipe for controlling operation of said scanning electron microscope in accordance with said setting;
   wherein said program runs said computer to obtain a simulation result of execution of design data of a sample, quantify degree of risk of a pattern for a region on said sample in accordance with result of said simulation, and set a small field of view opposed to another region as to a region of which degree of risk is large.

9. The computer readable storage medium according to claim 8, in combination with a recipe generation apparatus of scanning electron microscope equipped with said computer.

10. A non-transitory computer readable storage medium storing a program to be executed by computer for setting a field of view of a scanning electron microscope into a plurality of positions and for generating recipe for controlling operation of said scanning electron microscope in accordance with said setting;

wherein said program runs said computer to classify kinds of circuits included in design data of a sample, and set a field of view of said scanning electron microscope smaller in proportion as importance set for each kind of circuit becomes higher.

11. The computer readable storage medium according to claim 10, in combination with a recipe generation apparatus of scanning electron microscope equipped with said computer.

12. A non-transitory computer readable storage medium storing a program to be executed by a computer for carrying out an image processing of an image obtained by scanning electron microscope for generating the image in accordance with electrons obtained by scanning electrons on a sample;

wherein said program runs said computer for adding identification information to each of a plurality of fragments which constitute a pattern within said image acquired by said scanning electron microscope, said identification information being added to each fragment for distinguishing one fragment from another fragment, and for carrying out matching of said identification information among adjacent images within plural images to execute superimposition of said plural images such that an edge of a same pattern is superimposed with an edge of another same pattern.

13. The computer readable storage medium according to claim 12, wherein said program runs said computer to add said identification information to each fragment based on design data on said sample.

14. The computer readable storage medium according to claim 12, in combination with a pattern image generating apparatus equipped with said computer.

15. A non-transitory computer readable storage medium storing a program to be executed by a computer for carrying out an image processing of an image obtained by scanning electron microscope for generating the image in accordance with electrons obtained by scanning electrons on a sample;

wherein said program runs said computer to detect edge expressed within the image obtained by said scanning electron microscope, and carry out a first thinning process for a part having brightness higher than a first threshold for said edge, judge existence ratio of the edge as to part which is lower than said first threshold and higher than a second threshold which is a value lower than said first threshold, and connect deficit portion of contour line formed by said first thinning process for the part of which existence ratio of said edge is higher than a predetermined value.

16. The computer readable storage medium according to claim 15, in combination with a pattern image generating apparatus equipped with said computer.

* * * * *